United States Patent
Ryu et al.

(10) Patent No.: US 10,522,519 B2
(45) Date of Patent: Dec. 31, 2019

(54) DISPLAY MODULE, DISPLAY DEVICE AND METHODS OF ASSEMBLING AND DISASSEMBLING DISPLAY MODULE

(71) Applicant: SAMSUNG ELECTRONICS CO., LTD., Suwon-si (KR)

(72) Inventors: Chang Won Ryu, Suwon-si (KR); Huu Lam Vuong Nguyen, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/192,295

(22) Filed: Jun. 24, 2016

(65) Prior Publication Data

US 2017/0006727 A1    Jan. 5, 2017

(30) Foreign Application Priority Data

Jun. 24, 2015  (KR) ........................ 10-2015-0089647

(51) Int. Cl.
*G02F 1/1333* (2006.01)
*G09F 9/302* (2006.01)
(Continued)

(52) U.S. Cl.
CPC ........ *H01L 25/0753* (2013.01); *G09F 9/3026* (2013.01); *G09F 9/33* (2013.01);
(Continued)

(58) Field of Classification Search
CPC ...... G09F 9/3026; G09F 9/33; G09F 15/0068; G06F 3/1446; F21V 17/105; G02F 2001/133322; H01L 25/0753
See application file for complete search history.

(56) References Cited

U.S. PATENT DOCUMENTS 3,744,833 A * 7/1973 Berducone .......... E05B 47/0038
                                                    292/251.5
4,380,162 A * 4/1983 Woolfson ............ E05B 47/0044
                                                    70/276
(Continued)

FOREIGN PATENT DOCUMENTS

CN         201655193      * 11/2010
CN         201655193 U    11/2010
(Continued)

OTHER PUBLICATIONS

Search Report dated Sep. 30, 2016 issued by the International Searching Authority in counterpart International Application No. PCT/KR2016/006511 (PCT/ISA/210).
(Continued)

*Primary Examiner* — James Wu
(74) *Attorney, Agent, or Firm* — Sughrue Mion, PLLC

(57) ABSTRACT

Provided are a display module, a display device, and method of assembling and disassembling the display module. The display module includes a cabinet, a light-emitting diode (LED) panel mounted on the cabinet, and a coupling device configured to detachably mount the LED panel on the cabinet, wherein the coupling device comprises a first coupling member and a second coupling member, and at least one of the first coupling member and the second coupling member is configured to be moved by mutual magnetic force.

10 Claims, 19 Drawing Sheets

(51) Int. Cl.
*H01L 25/075* (2006.01)
*G09F 9/33* (2006.01)
*G06F 3/14* (2006.01)
*G09F 15/00* (2006.01)

(52) U.S. Cl.
CPC ............ *G02F 2001/133322* (2013.01); *G06F 3/1446* (2013.01); *G09F 15/0068* (2013.01)

(56) References Cited

U.S. PATENT DOCUMENTS

| | | | | |
|---|---|---|---|---|
| 5,188,405 | A * | 2/1993 | Maccaferri | ........... E05B 47/004 292/204 |
| 5,949,581 | A | 9/1999 | Kurtenbach et al. | |
| 2008/0232061 | A1 | 9/2008 | Wang et al. | |
| 2011/0216485 | A1 * | 9/2011 | Kang | ................. H04M 1/0254 361/679.01 |
| 2013/0086797 | A1 * | 4/2013 | Davis | ..................... H05K 13/00 29/592.1 |
| 2014/0003052 | A1 * | 1/2014 | Hemiller | ................. F21V 21/34 362/249.02 |
| 2014/0078685 | A1 * | 3/2014 | Lee | ..................... H05K 5/0017 361/730 |
| 2014/0091686 | A1 * | 4/2014 | Pegg | ................... H04M 1/0252 312/222 |
| 2016/0165745 | A1 * | 6/2016 | Choi | .................... F16M 11/043 361/679.01 |
| 2016/0210886 | A1 * | 7/2016 | Brashnyk | .............. G09F 9/3026 |

FOREIGN PATENT DOCUMENTS

| | | | |
|---|---|---|---|
| CN | 202939926 | U | 5/2013 |
| CN | 103337224 | A | 10/2013 |
| CN | 103680318 | A | 3/2014 |
| CN | 104112403 | A | 10/2014 |
| CN | 204130101 | U | 1/2015 |
| CN | 204178650 | * | 2/2015 |
| CN | 204178650 | U | 2/2015 |
| CN | 204437621 | U | 7/2015 |
| KR | 20-2010-0010932 | U | 11/2010 |
| KR | 20-0464801 | Y1 | 2/2013 |
| KR | 10-1452110 | B1 | 10/2014 |
| KR | 101541402 | B1 | 8/2015 |
| WO | 2010/125383 | A1 | 11/2010 |
| WO | 2010125383 | A1 | 11/2010 |
| WO | WO 2016065862 | A1 * | 5/2016 ............... G09F 9/33 |
| WO | 2016/208918 | A1 | 12/2016 |

OTHER PUBLICATIONS

International Search Report, dated Sep. 8, 2017 by the International Searching Authority in International Application No. PCT/KR2017/005576 (PCT/ISA/210).
Communication dated Feb. 8, 2018 by the European Patent Office in counterpart European Patent Application No. 16814631.4.
Non-Final Office dated Aug. 10, 2018, issued by the USPTO in counterpart U.S. Appl. No. 15/606,772.
Restriction Requirement dated Jul. 18, 2018, issued by the USPTO in counterpart U.S. Appl. No. 15/606,772.
Communication dated May 24, 2019, issued by the European Patent Office in counterpart European Application No. 17834616.9.
Communication dated Jul. 16, 2019, issued by the Korean Patent Office in counterpart Korean Application No. 10-2016-0094628.
Communication dated May 9, 2019, isued by the European Patent Office in counterpart European Application No. 16 814 631.4.
Communication dated Aug. 1, 2019 issued by the State Intellectual Property Office of P.R. China in counterpart Chinese Application No. 201680031462.7.

* cited by examiner

DISPLAY MODULE, DISPLAY DEVICE AND METHODS OF ASSEMBLING AND DISASSEMBLING DISPLAY MODULE

CROSS-REFERENCE TO RELATED APPLICATION

This application claims priority from Korean Patent Application No. 10-2015-0089647, filed on Jun. 24, 2015 in the Korean Intellectual Property Office, the disclosure of which is incorporated herein by reference.

BACKGROUND

1. Field

Apparatuses and methods consistent with exemplary embodiments relate to a display module, a display device including the same, and methods of assembling and disassembling the display module.

2. Description of the Related Art

In a light-emitting diode (LED) display device, a large-sized screen may be implemented using small-sized LED panels.

In a related art, an LED display device in which a pitch between LEDs arranged in an LED panel is large has mainly been used as a large-sized outdoor display device.

However, recently, as a demand for high definition large display devices has increased, various studies on display devices in which a pitch between LEDs arranged in an LED panel is small have been conducted.

Also, as a demand for very large display devices or indoor large display devices has increased, various studies on display devices which are easy to move and install have been conducted.

SUMMARY

One or more exemplary embodiments provide a display module in which a plurality of light-emitting diode (LED) panels, which are mounted on the display module constituting a display device, may be easily assembled and separated using magnetic force, and the display device.

One or more exemplary embodiments also provide methods of assembling and separating a display module in which LED panels may be easily assembled with and separated from the display module using magnetic force.

According to an aspect of an exemplary embodiment, there is provided a display module including: a cabinet; a light-emitting diode (LED) panel mounted on the cabinet; and a coupling device configured to detachably mount the LED panel on the cabinet. The LED panel may be assembled to the cabinet by a magnetic force using the coupling device.

The coupling device may include a first coupling member and a second coupling member. The first coupling member and the second coupling member may be moved by mutual magnetic force to be locked or unlocked.

The coupling device may be configured so that at least one of the first coupling member and the second coupling member is moved to a locking position by a mutual magnetic attractive force.

The coupling device may be configured so that at least one of the first coupling member and the second coupling member is moved to an unlocking position by a mutual magnetic repulsive force.

The first coupling member may be provided at the LED panel and may include an engaging portion. The second coupling member may be provided at the cabinet and may include an accommodating groove configured to accommodate the first coupling member and a locking portion configured to fix the engaging portion of the first coupling member by moving to a locking position when the first coupling member is accommodated in the accommodating groove.

The first coupling member may include a magnetic material. The locking portion of the second coupling member may include a magnet.

The second coupling member may include a magnetic material configured to maintain the locking portion at an unlocking position by a magnetic force when the LED panel is not mounted on the cabinet.

The second coupling member may be fixed to the cabinet by a fixing member including a magnetic material. The fixing member may be disposed so that the locking portion is maintained at an unlocking position by a magnetic force when the LED panel is not mounted on the cabinet.

The LED panel and the cabinet may be formed of a non-magnetic material.

The cabinet may include a step adjuster disposed adjacent to the coupling device in order to adjust a step between the LED panel and another LED panel.

The step adjuster may include a step adjusting hole and a step adjusting bolt inserted into the step adjusting hole and configured to move by rotation to press the LED panel.

The LED panel may include a guide member configured to guide a direction in which the LED panel is mounted on the cabinet. The cabinet may include a guide groove into which the guide member is inserted.

The cabinet may include a connecting device provided to be coupled to another display module.

According to another aspect of an exemplary embodiment, there is provided a display device including a plurality of display modules. Each of the display modules may include: a cabinet; a plurality of LED panels mounted on the cabinet, each of the LED panels including a plurality of LEDs; a coupling device configured to detachably mount the plurality of LED panels on the cabinet; and a connecting device provided to be coupled to another adjacent display module. The LED panels are assembled to the cabinet by a magnetic force using the coupling device.

The coupling device may include a first coupling member and a second coupling member which are moved by mutual magnetic force to be locked or unlocked.

According to another aspect of an exemplary embodiment, there is provided a display module assembly kit including: an LED panel in which a first coupling member is provided; a cabinet in which a second coupling member is provided and the LED panel is detachably mounted by using the first coupling member and the second coupling member; and an auxiliary tool configured to magnetize at least one of the first coupling member and the second coupling member so that the first coupling member and the second coupling member are moved by a mutual magnetic force to be locked or unlocked.

One of the first coupling member and the second coupling member may include a magnetic material, the other of the first coupling member and the second coupling member may include a magnet, and the auxiliary tool magnetizes the magnetic material so that an attractive force or a repulsive force acts with the magnet and moves at least one of the first coupling member and the second coupling member to a locking or unlocking position.

The first coupling member may be disposed on a back surface of the LED panel and includes an engaging portion. The second coupling member may be disposed on a front surface of the cabinet and may include an accommodating groove configured to accommodate the first coupling member and a locking portion moved to a locking position when the first coupling member is accommodated in the accommodating groove and configured to fix the engaging portion of the first coupling member.

The first coupling member may include a magnetic material. The locking portion of the second coupling member may include a magnet. The auxiliary tool may magnetize the magnetic material so that an attractive force acts with the magnet when the first coupling member is accommodated in the accommodating groove and moves the locking portion to the locking position.

The auxiliary tool may magnetize the magnetic material so that a repulsive force acts with the magnet in order to prevent the locking portion from being moved to the locking position before the first coupling member is accommodated in the accommodating groove or in order to move the locking portion from the locking position to the unlocking position.

The second coupling member may include a magnetic material configured to maintain the locking portion to be at the unlocking position by the attractive force with the magnet included in the locking portion when the LED panel is not mounted on the cabinet. The auxiliary tool may magnetize the magnetic material included in the first coupling member so that the attractive force acts with the magnet included in the locking portion in order to move the locking portion to the locking position after the engaging portion of the first coupling member is accommodated in the accommodating groove.

The auxiliary tool may include a body provided to have a size and a shape corresponding to the LED panel and a magnet provided to correspond to a position of the first coupling member provided in the LED panel.

According to another aspect of an exemplary embodiment, there is provided an auxiliary tool for assembling a display module comprising a cabinet on which an LED panel is mounted by using a coupling device comprising a first coupling member and a second coupling member, the auxiliary tool includes: a body; and a plurality of magnets configured to magnetize at least one of the first coupling member and the second coupling member so that the first coupling member and the second coupling member are moved by a mutual magnetic force to be locked or unlocked.

The auxiliary tool may further include an opening provided in the body to be used as a space for pushing the LED panel when the auxiliary tool is attached to the LED panel or is removed from the LED panel by a magnetic force.

The body is configured to have a size and a shape corresponding to the LED panel and the magnet configured to correspond to a position of the first coupling member provided in the LED panel.

BRIEF DESCRIPTION OF THE DRAWINGS

These and/or other aspects of the disclosure will become apparent and more readily appreciated from the following description of the exemplary embodiments, taken in conjunction with the accompanying drawings, in which.

DETAILED DESCRIPTION OF EXEMPLARY EMBODIMENTS

Figure 1:
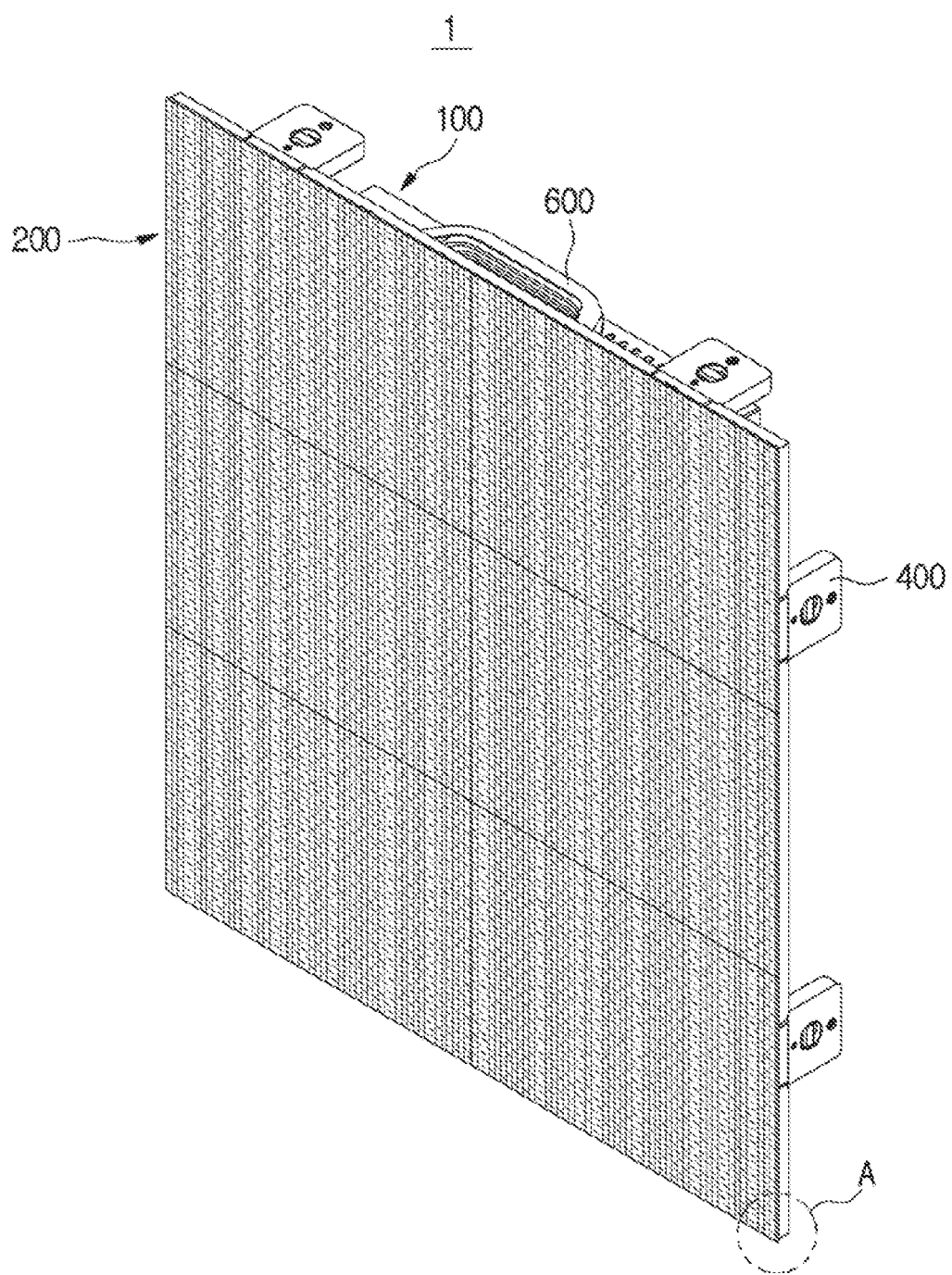
FIG. 1 is a perspective view illustrating an exterior of a display module according to an exemplary embodiment in one side view.

A display module according to the exemplary embodiment has a structure in which a plurality of light-emitting diode (LED) panels are continuously disposed in vertical and horizontal directions and images are displayed, and a display device according to the exemplary embodiment has a structure in which display modules are continuously disposed in vertical and horizontal directions and the display device is configured to a user's desired size.

Generally, a very large display device is not easy to manufacture and install, but, a display device formed by connecting display modules may be installed regardless of size and location because the display modules are manufactured to have a relatively small size and are easily moved.

Meanwhile, as described above, as a demand for ultra-high definition display devices has increased, sizes of LEDs which are arranged in the LED panel for forming an image and forms pixels are decreased, and an interval at which the LEDs are arranged is also decreased.

When the interval at which the LEDs are arranged in the LED panel is decreased, a related art method of fixing the LED panel to a space between the LEDs at a front surface in which the LEDs are arranged by using screws and the like may not be used.

However, as the size of the display device increases, an operator may easily operate at the front surface of the display device when the LED panel is separated or replaced for the maintenance of the display device.

A display module, a display device, and methods of assembling and disassembling the display module according to the exemplary embodiment provide a structure and methods in which LED panels may be separated and assembled at a front surface of the display module.

Hereinafter, the display module, the display device including the same, and the methods of assembling and disassembling the display module according to the exemplary embodiment will be described in detail with reference to the accompanying drawings. As used herein, the singular forms "a," and "an" are intended to also include the plural forms unless the context clearly indicates otherwise. In addition, a shape and a size of the elements in the drawings may be exaggerated for a more precise description.

Figure 2:
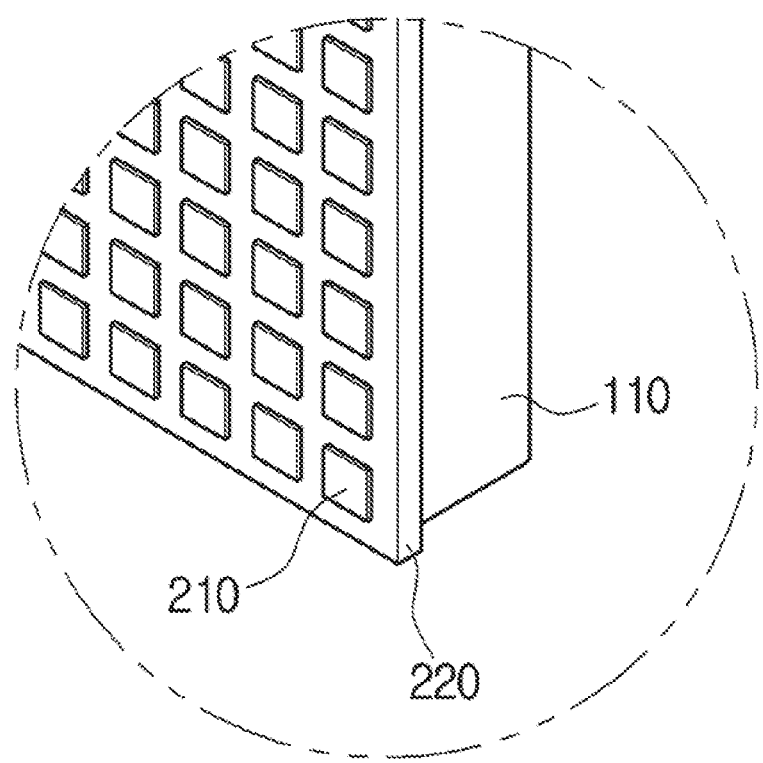
FIG. 2 is an enlarged perspective view illustrating portion A of an LED panel of FIG. 1.
Figure 3:
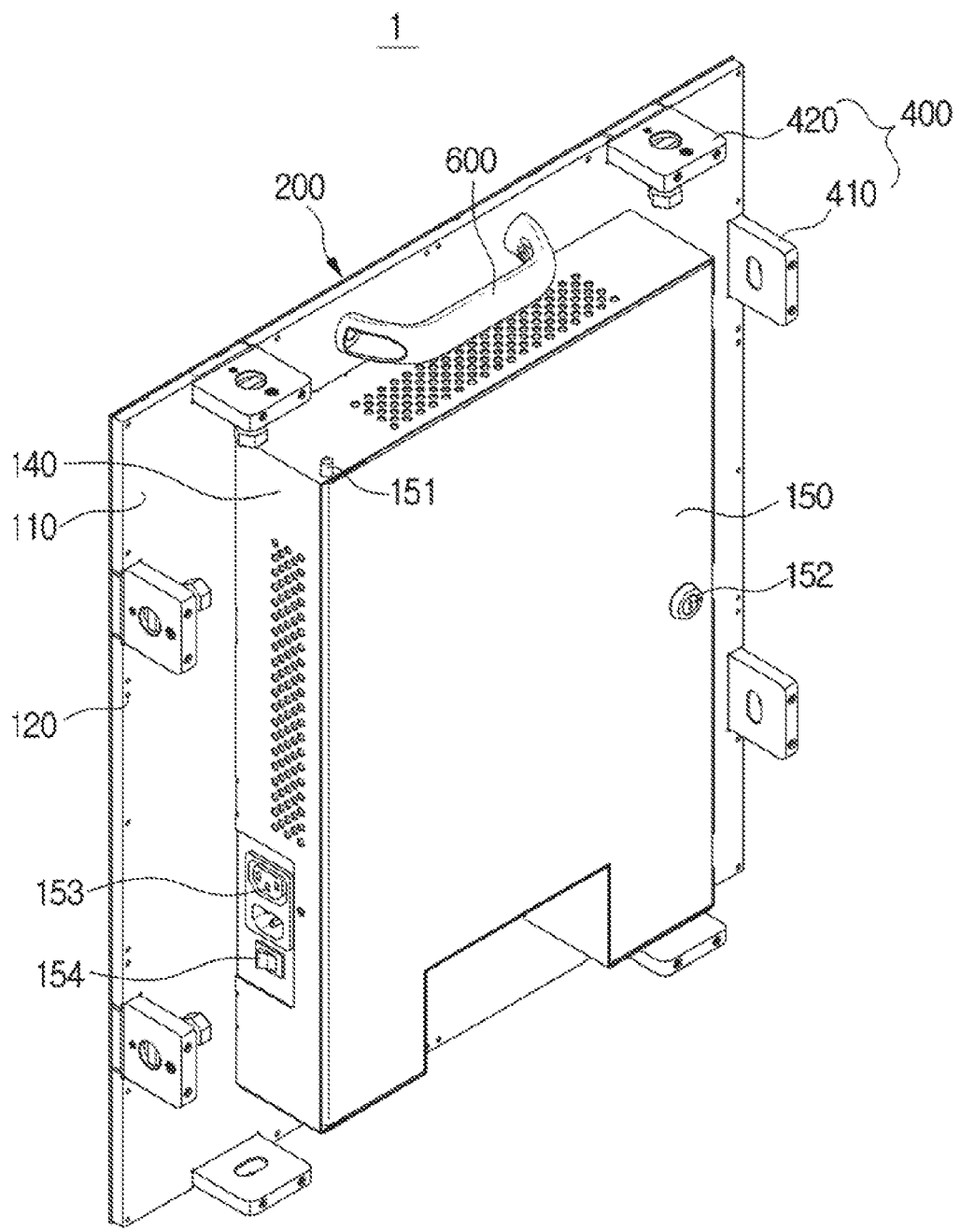
FIG. 3 is a perspective view illustrating the exterior of the display module of FIG. 1 in the other side view.

FIG. 1 is a perspective view illustrating an exterior of a display module according to an exemplary embodiment o in one side view, and FIG. 2 is an enlarged perspective view illustrating portion A of an LED panel of FIG. 1. FIG. 3 is a perspective view illustrating the exterior of the display module of FIG. 1 in the other side view.

Referring to FIGS. 1 to 3, a display module 1 may include a cabinet 100 and a plurality of LED panels 200 disposed on the cabinet 100.

The cabinet 100 of the display module 1 may include a base plate 110 on which the LED panels 200 are mounted, sidewalls 140, and a door 150. Also, a connecting device 400 configured to be coupled to another display module and a handle 600 configured to facilitate movement of the display module 1 may be provided at the base plate 110.

The sidewalls 140 may be coupled to the base plate 110, and the door 150 may be coupled to the sidewalls 140 by a hinge 151. A door-lock 152 may be installed at a side opposite to a side at which the door 150 is coupled to the sidewall 140 by the hinge 151.

A signal control board, which controls the plurality of LED panels 200, and a power supply, which supplies power to the LED panels 200, may be disposed inside the cabinet 100.

Spaces may be provided in the sidewalls 140 or the door 150 so that various ports connected to the signal control board may be exposed to the outside. A power port 153, which may receive power source or relay the power source to another module, and a switch 154, which turns the power on and off, may be provided at the door 150 or the sidewall 140.

As a back cover of the cabinet 100 is provided as the door 150 having a hinged door shape, convenience may be provided when maintaining the display module 1, and as an inlet port and an outlet port are simultaneously provided in the power port 153, the display module 1 and another display module may be connected to each other using a cascade method so as to easily supply power to each of the display modules when the display module 1 is coupled to another display module.

Each of the LED panels 200 may include an LED substrate 220 in which a plurality of LEDs 210 are arranged.

When a plurality of LED panels 200 are mounted on the cabinet 100, a boundary or a seam may be formed between LED panels 200 disposed adjacent to each other. When a size of each of the LEDs 210 arranged in the LED substrate 220 is decreased in order to form a high definition image, an interval between the LEDs 210 may be decreased. When an interval between the LED panels 200 is greater than the interval between the LEDs 210 or when a step is generated between the LED panels 200, the boundary between the LED panels 200 may be shown.

In the display module 1 according to the exemplary embodiment, the LED panels 200 may be disposed close to each other in order to implement a seamless display on which a boundary between the LED panels 200 is not shown, and a plurality of step adjusters 120 configured to adjust a step between the LED panels 200 may be included.

A coupling device for mounting the LED panels 200 on the display module 1 will be described in detail with reference to FIGS. 4 to 8.

Figure 4:
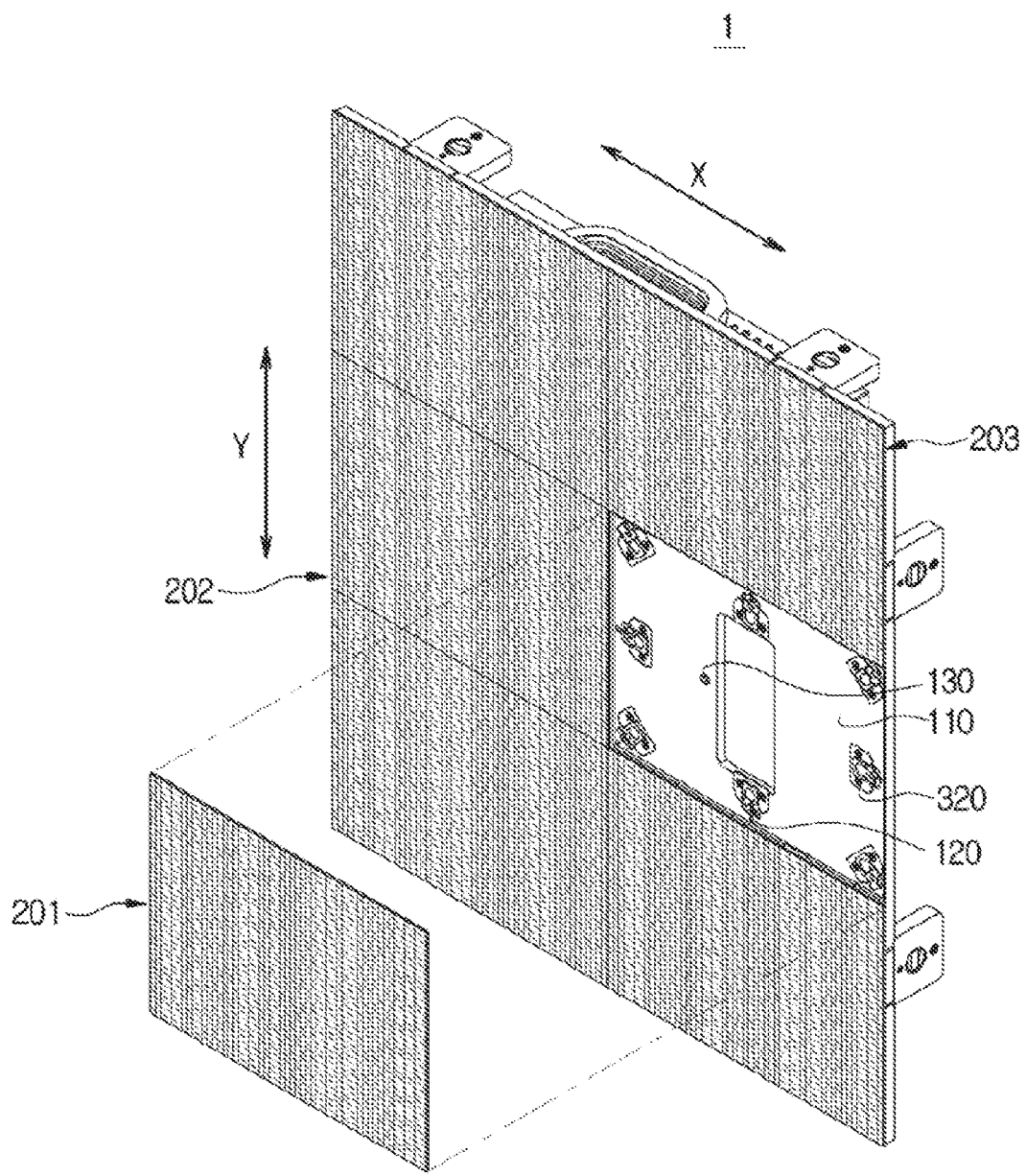
FIG. 4 is an exploded perspective view illustrating a single LED panel of the display module of FIG. 1.
Figure 5:
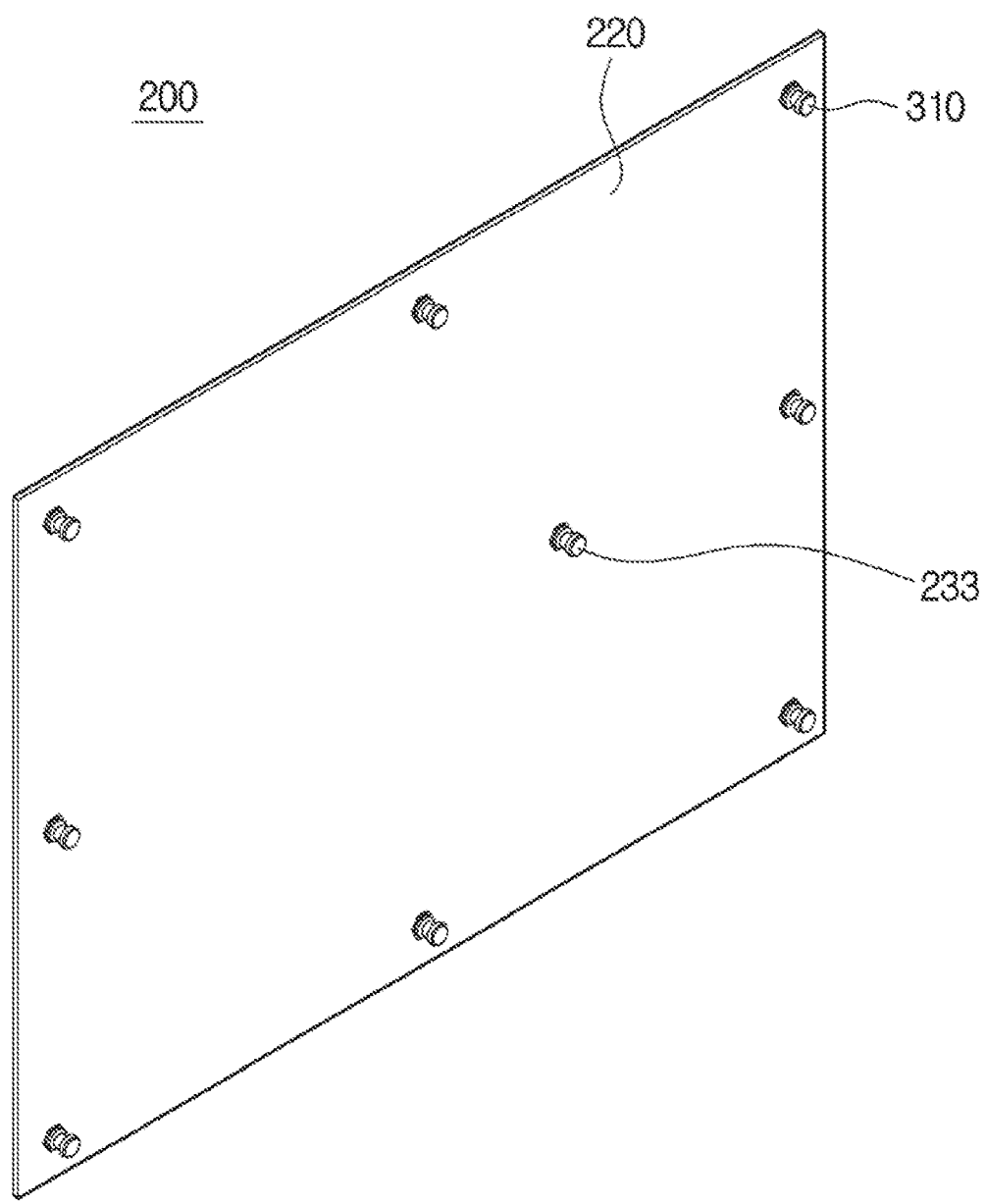
FIG. 5 is a perspective view illustrating the LED panel of the display module of FIG. 4 in the other side view.
Figure 6:
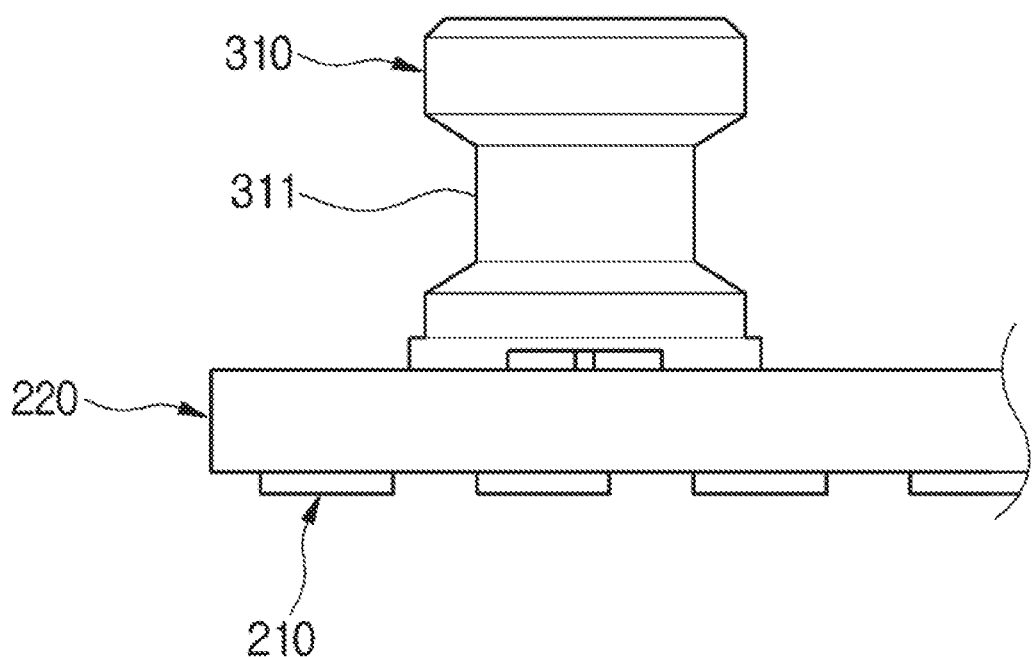
FIG. 6 is a side view illustrating a coupling member provided in the LED panel of FIG. 5.
Figure 7:
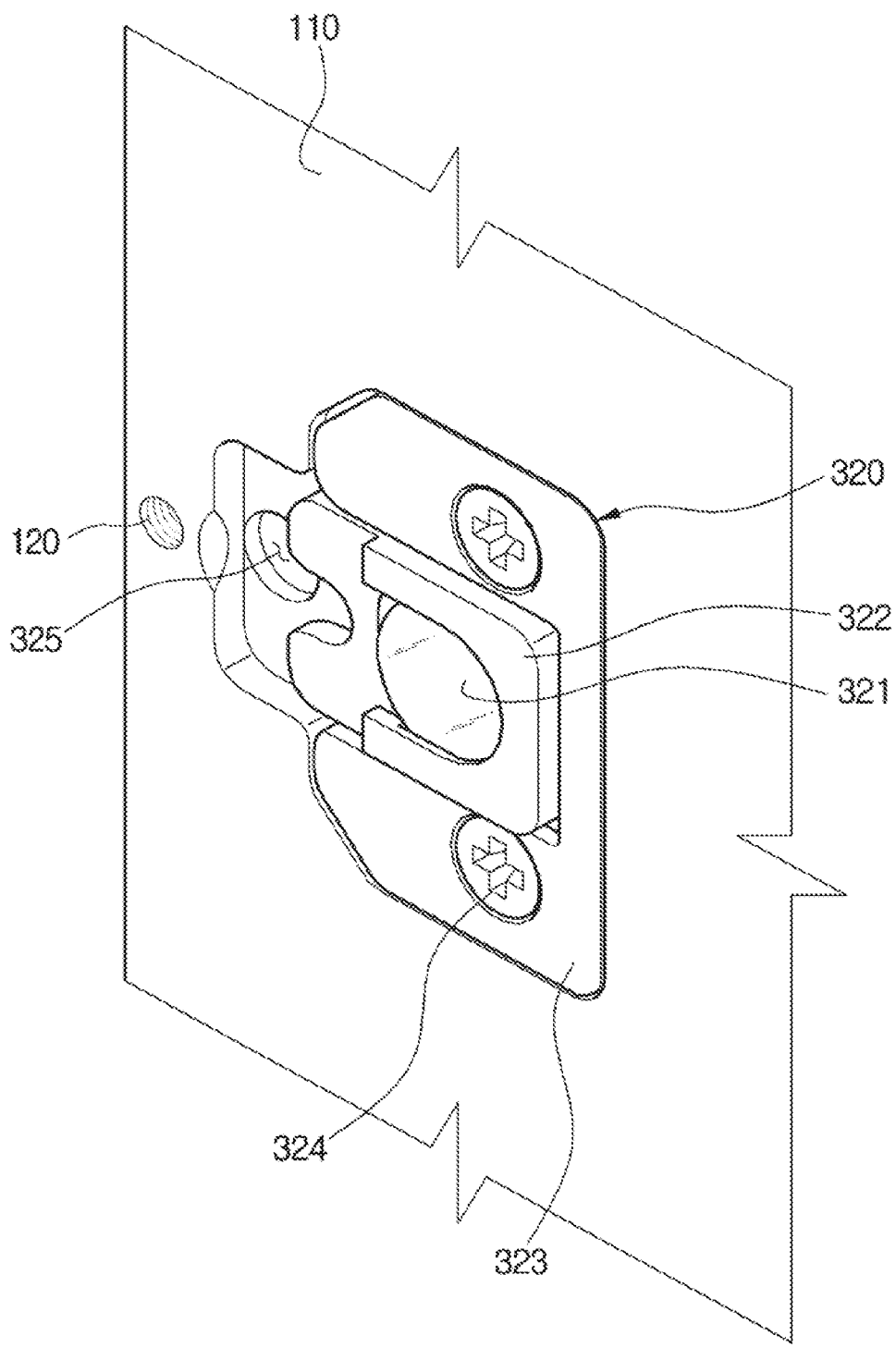
FIG. 7 is an enlarged view illustrating the coupling member provided on the cabinet of the display module of FIG. 4.
Figure 8:
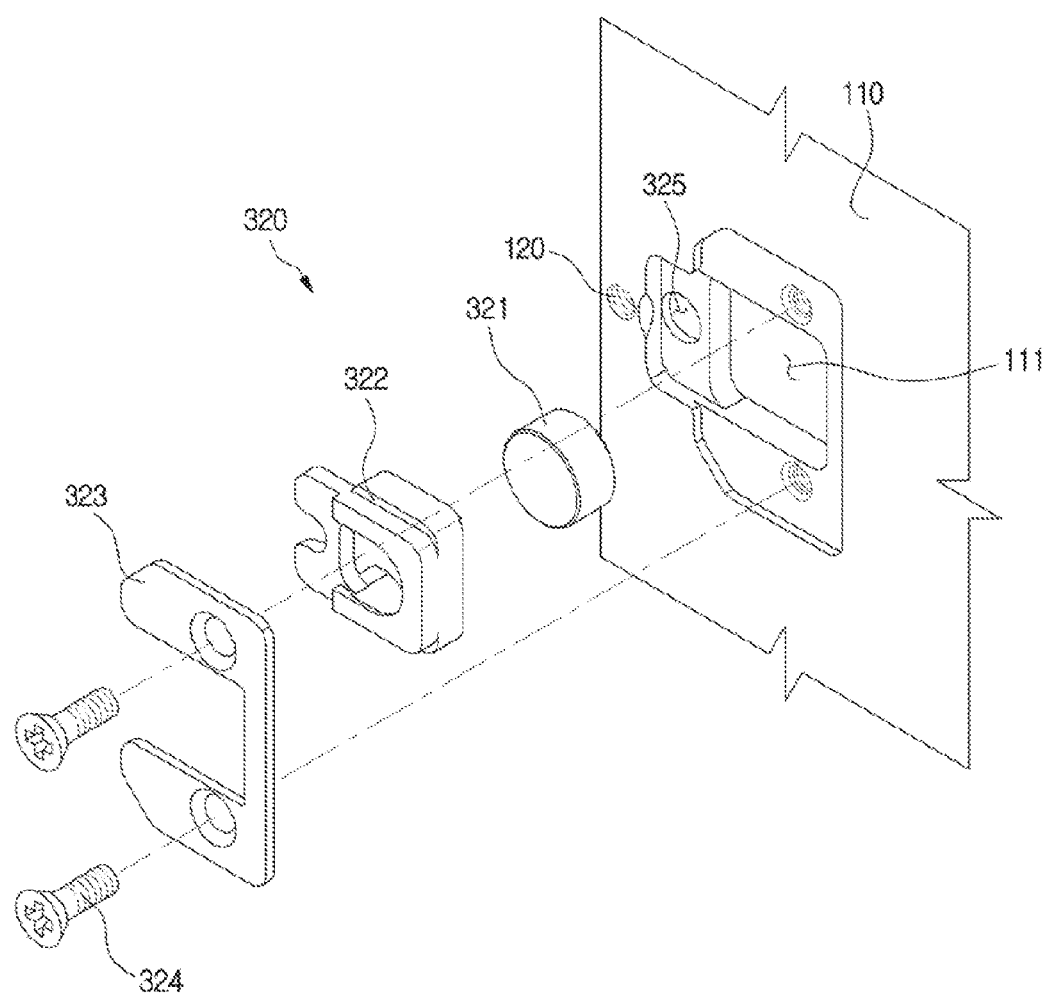
FIG. 8 is an exploded perspective view illustrating the coupling member provided on the cabinet of FIG. 7.

FIG. 4 is an exploded perspective view illustrating a single LED panel of the display module of FIG. 1. FIG. 5 is a perspective view illustrating the LED panel of the display module of FIG. 4 in the other side view, and FIG. 6 is a side view illustrating a coupling member provided in the LED panel of FIG. 5. FIG. 7 is an enlarged view illustrating the coupling member provided on the cabinet of the display module of FIG. 4, and FIG. 8 is an exploded perspective view illustrating the coupling member provided on the cabinet of FIG. 7.

Referring to FIG. 4, the plurality of LED panels 200 included in the display module 1 according to the exemplary embodiment may include a first LED panel 201 and a second LED panel 202 arranged in a first direction X with respect to the first LED panel 201. The plurality of LED panels 200 may further include a third LED panel 203 arranged in a second direction Y with respect to the first LED panel 201.

The display module 1 illustrated in FIG. 4 according to the exemplary embodiment may include a total of six LED panels 200 configured to have two columns in the first direction X and three columns in the second direction Y.

The display module 1 may include a coupling device configured to detachably mount the plurality of LED panels 200 on the cabinet 100. The coupling device may include first coupling members 310 provided in the plurality of LED panels 200 and second coupling members 320 provided in the cabinet 100.

The plurality of step adjusters 120 may be arranged to adjust steps between edges of the first LED panel 201 and the second LED panel 202, which are adjacent to each other in the first direction X, and to adjust steps between edges of the first LED panel 201 and the third LED panel 203, which are adjacent in the second direction Y. The step adjusters 120 will be described below.

Referring to FIG. 5, the first coupling members 310 may be provided on a back surface of the LED substrate 220. The first coupling members 310 may be respectively provided at four corners and center portions of four edges of the LED panel 200 having a rectangular shape. The LED panel 200 may include a guide member 233 which is provided spaced apart from a center portion of the LED panel 200 in any direction in order to guide a direction in which the LED panel 200 is mounted on the cabinet 100.

Referring to FIG. 6, the first coupling members 310 may be fixed to a surface opposite to a surface at which the LEDs 210 in the LED substrate 220 are disposed by soldering and the like. The first coupling members 310 may include a material magnetized in a magnetic field, that is, a magnetic material, or may be formed of the magnetic material.

Each of the first coupling members 310 may include an engaging portion 311 provided to prevent the first coupling member 310 from being separated when it is coupled to the second coupling member 320. The engaging portion 311 may be formed in a form in which a portion of the first coupling member 310 having a pillar shape is recessed as illustrated in FIG. 6, and may be formed in any form in which the first coupling member 310 may not be separated when being coupled to the second coupling member 320.

Referring back to FIG. 4, the plurality of second coupling members 320 for fixing the plurality of LED panels 200 to the cabinet 100 are provided at the cabinet 100 of the display module 1, and the plurality of second coupling members 320 may be provided to respectively correspond to the plurality of first coupling members 310 provided in the LED panel 200.

A guide groove 130 into which the guide member 233 of the LED panel 200 is inserted may be provided in the cabinet 100, and is configured so that the guide member 233 is inserted into the guide groove 130 only when the LED panel 200 is mounted in a proper direction.

Referring to FIGS. 7 and 8, the second coupling member 320 may be provided in a form to be embedded into the base plate 110 of the cabinet 100. An embedded portion 111 of the second coupling member 320 is formed in the base plate 110, and the embedded portion 111 may include an accommodating groove 325 capable of accommodating the first coupling member 310. A locking portion 322 configured to fix the engaging portion 311 of the first coupling member 310 is disposed in the embedded portion 111. The locking portion 322 is configured to move to a locking position and an unlocking position.

FIG. 7 is a view illustrating a state in which the locking portion 322 is at the unlocking position. The locking portion 322 may include a magnet 321 for moving the locking portion 322 to the locking position or the unlocking position by magnetic force. The magnet 321 and the locking portion 322 are disposed in the embedded portion 111 of the base plate 110, and a cover 323 is fixed to the base plate 110 by fixing members 324.

The fixing members 324 may be formed of a magnetic material and may include the magnetic material. If the second coupling member 320 is not coupled to the first coupling member 310, the locking portion 322 may be maintained at the unlocking position by a magnetic attractive force between the magnet 321 and the fixing members 324 when there is no other external force. The second coupling member 320 may further include a magnetic material which maintains the fixing members 324 and the locking portion 322 at the unlocking position.

When the locking portion 322 moves to the locking position by an external magnetic attractive force using a separate magnet and the like after the first coupling member 310 is accommodated in the accommodating groove 325 of the second coupling member 320, a distance between the magnet 321 and the first coupling member 310 becomes smaller than a distance between the magnet 321 and the fixing member 324, and a magnetic attractive force between the magnet 321 and the first coupling member 310 becomes greater than a magnetic attractive force between the magnet 321 and the fixing members 324. Therefore, the locking portion 322 may be maintained at the locking position by the magnetic attractive force with the first coupling member 310.

When the first coupling member 310 coupled to the second coupling member 320 is magnetized using the separate magnet and the like so that a magnetic repulsive force acts between the first coupling member 310 and the magnet 321 included in the locking portion 322, the locking portion 322 may be moved to the unlocking position and may be maintained at the unlocking position by the magnetic attractive force between the magnet 321 and the fixing members 324 after the LED panel 200 is separated from the cabinet 100.

Other components of the second coupling member 320 except for the magnet 321 and the fixing members 324 may be formed of a non-magnetic material that does not react to a magnetic force, and the cabinet 100 and the LED panel 200 are also formed of the non-magnetic material.

Figure 9:
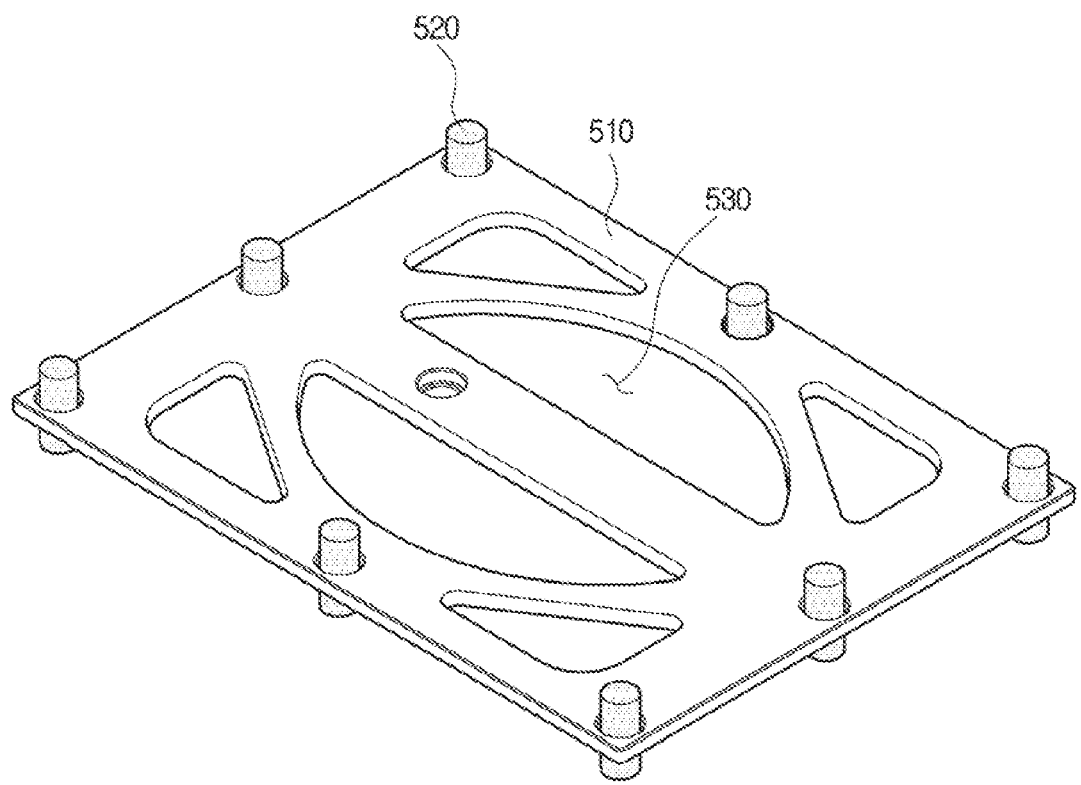
FIG. 9 is a perspective view illustrating the auxiliary tool.

An auxiliary tool 500 may be used to easily assemble or disassemble the LED panel 200 and the cabinet 100. FIG. 9 is a perspective view illustrating the auxiliary tool 500.

Referring to FIG. 9, the auxiliary tool 500 may include a body 510 and a plurality of magnets 520. The body 510 may be formed with a size and a shape corresponding to those of the LED panel 200, and the magnets 520 may be provided to correspond to positions of the first coupling members 310 provided in the LED panel 200. The plurality of magnets 520 provided in the auxiliary tool 500 may be disposed so that the same pole faces the same direction.

An opening 530 may be provide in the body 510 of the auxiliary tool 500, and may be used as a space for pushing the LED panel 200 when the auxiliary tool 500 is attached to the LED panel 200 and is removed from the LED panel 200 by a magnetic force. A portion of the body 510 may be used as a handle by forming of the opening 530, and a separate handle may be provided in the body 510.

Both poles of each of the magnets 520 provided in the auxiliary tool 500 may be used so that an attractive force or a repulsive force acts on the magnet 321 included in the second coupling member 320 according to an example in which the LED panels 200 are assembled with and/or separated from the cabinet 100. Therefore, the auxiliary tool 500 may be flipped upside down according to the required polarity of the magnets 520. Although not illustrated in the drawing, when the magnets 520 are provided with as electromagnets, the auxiliary tool 500 may be used without even flipping the auxiliary tool 500 upside down by changing the polarities of the magnets 520.

Methods of assembling and separating the LED panel 200 using the auxiliary tool 500 will be described below.

Hereinafter, the step adjusters 120 which adjust the steps between the LED panels 200 will be described with reference to FIGS. 4, 7, and 10.

Referring to FIG. 4, the plurality of step adjusters 120 may be provided at the cabinet 100 of the display module 1 to respectively correspond to the plurality of second coupling members 320, and may be disposed to be adjacent to the corresponding second coupling members 320.

The step adjusters 120 may be configured to adjust steps formed in a direction substantially perpendicular to a direction in which the plurality of LED panels 200 are arranged.

The step adjusters 120 may be disposed to press the LED panels 200 between the first coupling members 310 of the LED panel 200 and edges of the LED panel 200. The step adjusters 120 may finely adjust a step at a position close to a boundary with the adjacent LED panel 200 by pressing between the first coupling members 310 of the LED panel 200 and the edges of the LED panel 200.

Figure 10:
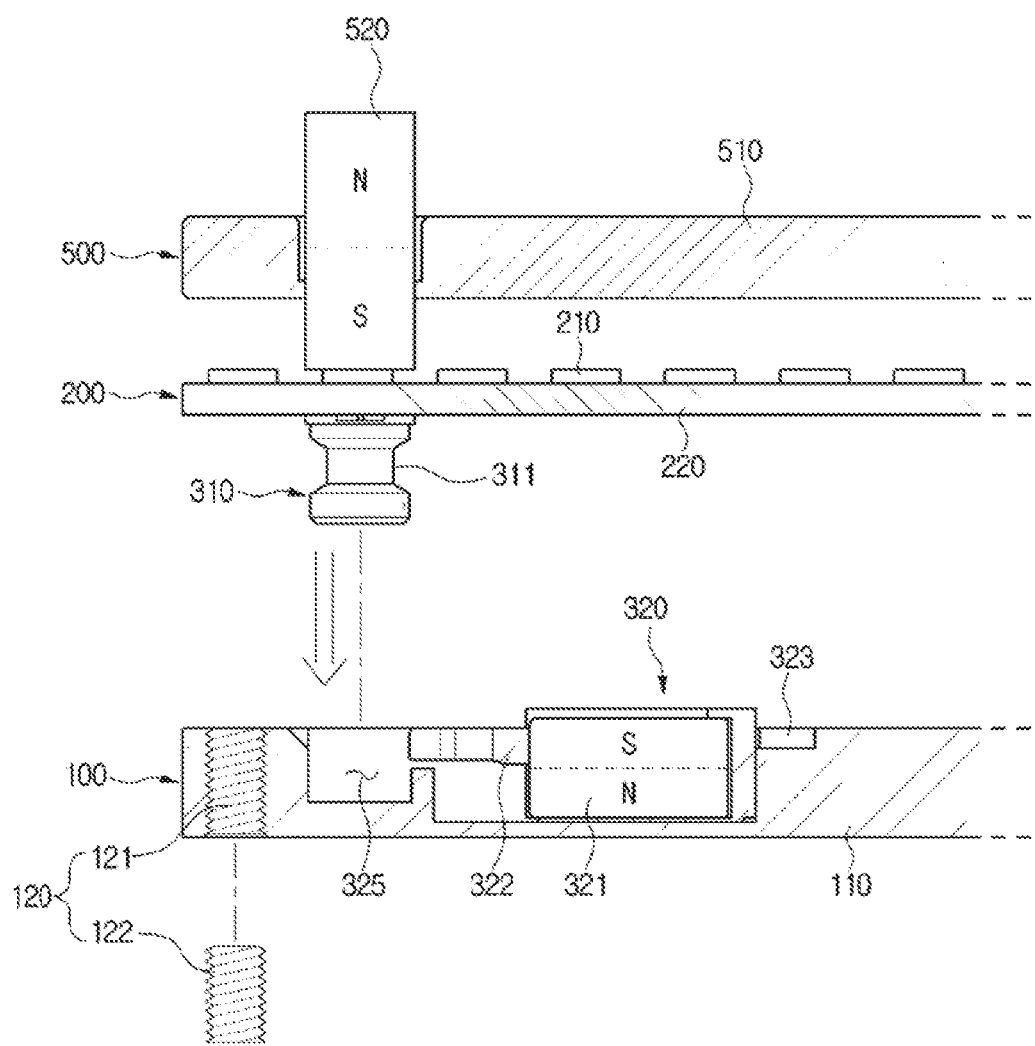
FIG. 10 is a view illustrating a process of disposing the LED panel on the cabinet according to the exemplary embodiment.

Referring to FIG. 10, the step adjuster 120 may include a step adjusting hole 121 provided in the base plate 110 of the cabinet 100 and a step adjusting bolt 122 inserted into the step adjusting hole 121. The step adjusting bolt 122 may be moved by being rotated in a direction perpendicular to the direction in which the LED panels 200 are arranged, and may press the LED substrate 220 of the LED panel 200 by the movement. The step adjusting bolt 122 may be a non-head bolt in which a hexagonal wrench is inserted into an end thereof.

Hereinafter, a method of assembling the LED panels 200 to the base plate 110 of the cabinet 100 will be described with reference to FIGS. 10 to 12 and 15.

FIG. 10 is a view illustrating a process of disposing the LED panel on the cabinet according to the exemplary embodiment, and FIG. 11 is a view illustrating a state in which the LED panel of FIG. 10 is disposed on the cabinet.

Figure 15:
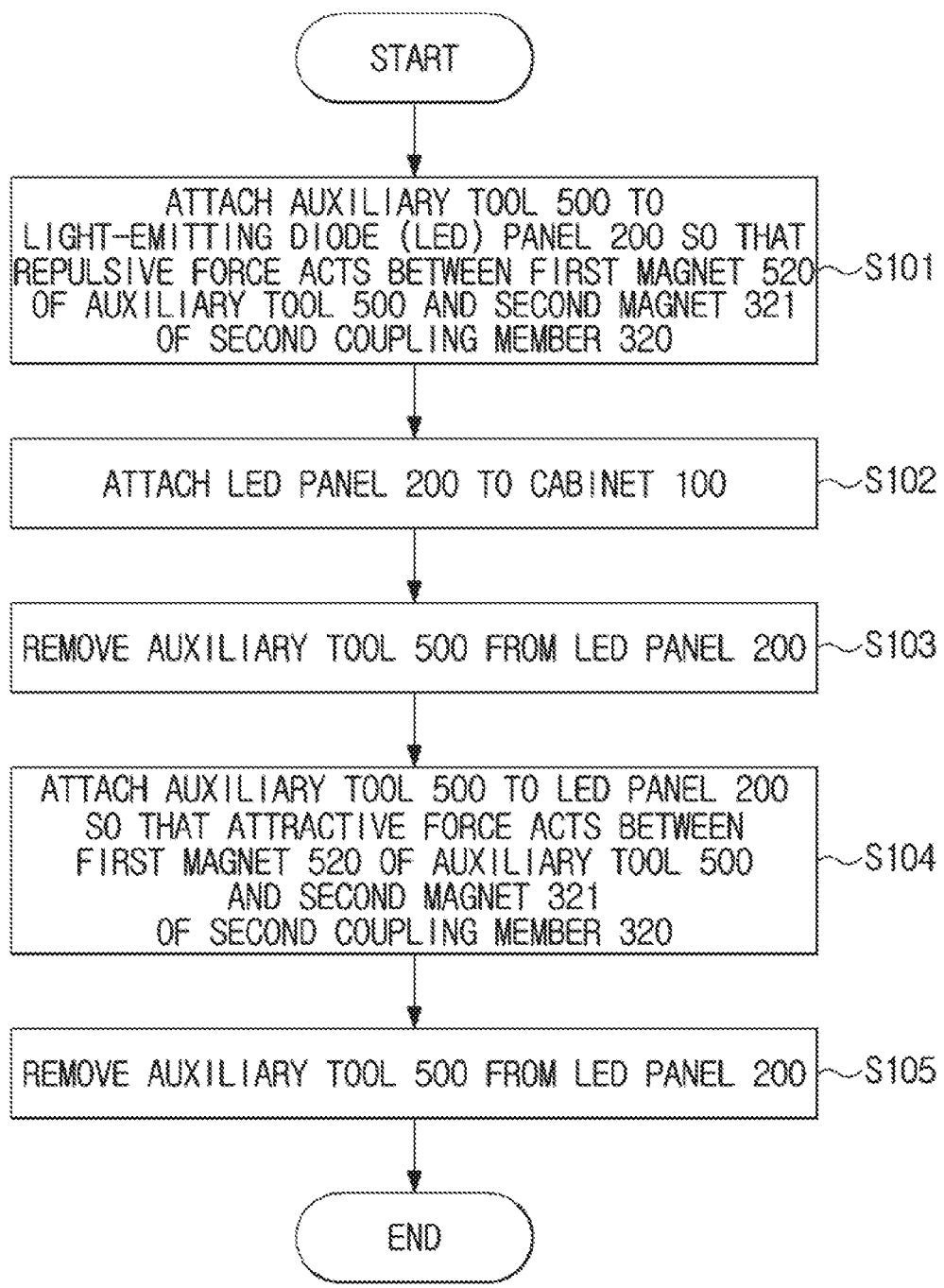
FIG. 15 is a flowchart of the method of assembling the display module according to the exemplary embodiment.

FIG. 12 is a view illustrating a state in which the coupling member provided on the cabinet is moved to a locking position in the state in which the LED panel of FIG. 11 is disposed on the cabinet. FIG. 15 is a flowchart of the method of assembling the display module according to the exemplary embodiment.

For example, the LED panel 200 in which the first coupling members 310 are provided and the cabinet 100 in which the second coupling members 320 are provided are prepared, and the auxiliary tool 500 is prepared to easily couple the LED panel 200 to the cabinet 100.

Referring to FIG. 10, the auxiliary tool 500 is attached to the LED panel 200 so that a repulsive force acts between a first magnet 520 of the auxiliary tool 500 and a second magnet 321 of the second coupling member 320 (operation S101). Although the repulsive force is illustrated to act between S poles in the drawings, the repulsive force may also act between N poles. Hereinafter, as illustrated in the drawings, a case in which the S poles are poles in which the repulsive force acts between the first magnet 520 and the second magnet 321 will be described.

When a surface which has the first magnet 520 of the auxiliary tool 500 is the S pole and is attached to the LED panel 200, since the first coupling member 310 provided in the LED panel 200 includes a magnetic material or is formed of the magnetic material, the first coupling member 310 is magnetized as the S pole. Therefore, when the LED panel 200 to which the auxiliary tool 500 is attached is moved close to the cabinet 100, the locking portion 322 of the second coupling member 320 is not moved from the unlocking position. Even when the locking portion 322 has been at the locking position, the locking portion 322 is moved to the unlocking position by a repulsive force. In the state in which the locking portion 322 is at the unlocking position, the LED panel 200 is attached to the cabinet 100 so that the engaging portion 311 of the first coupling member 310 is accommodated in the accommodating groove 325 of the second coupling member 320 (operation S102).

When the auxiliary tool 500 approaches the cabinet 100 by attaching the first magnet 520 and the second magnet 321 to the LED panel 200 so as to act on an attractive force therebetween or only the LED panel 200 approaches the cabinet 100 without the auxiliary tool 500, the locking portion 322 of the second coupling member 320 may be moved to the locking position by the attractive force between the magnetic material included in the first coupling member 310 and the second magnet 321 before the first coupling member 310 is accommodated in the accommodating groove 325. Also, when the LED panel 200 is inaccurately attached at an installation position by the attractive force between the first coupling member 310 and the second coupling member 320, small-sized LEDs 210 disposed at edges of the LED panel 200 may be damaged.

Figure 11A:
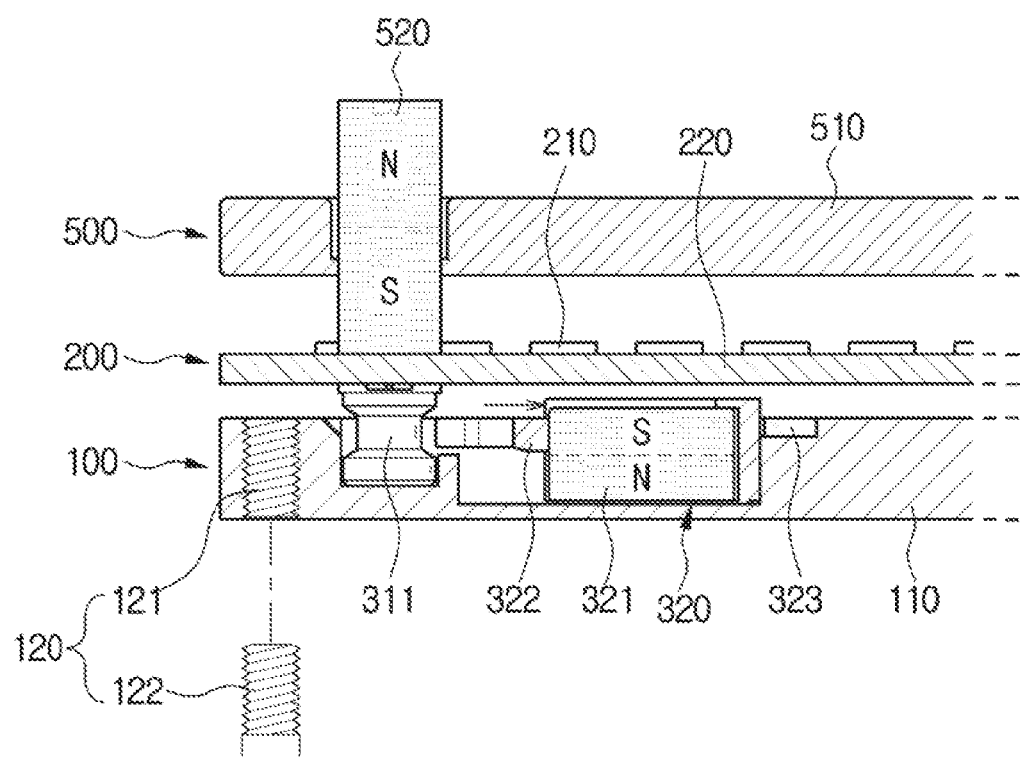
FIG. 11A and FIG. 11B are views illustrating a state in which the LED panel of FIG. 10 is disposed on the cabinet.
Figure 11B:
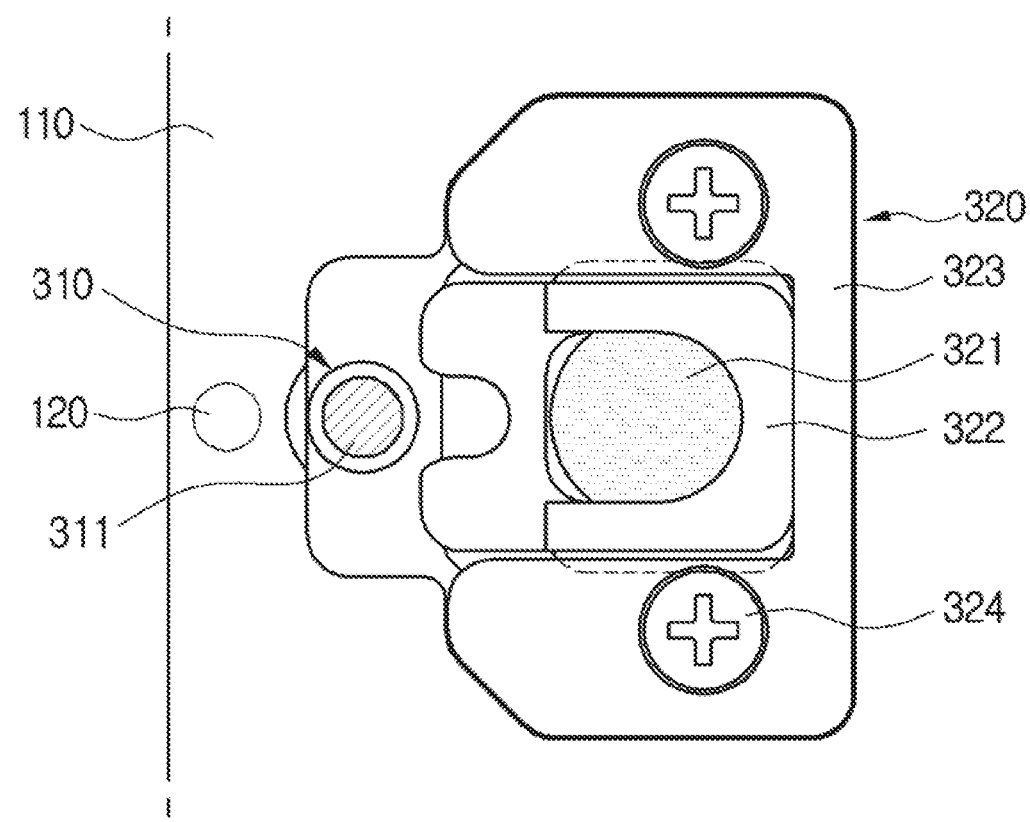

FIGS. 11A and 11B are views of a result in which the auxiliary tool 500 is attached to the LED panel 200 so that a repulsive force acts between the first magnet 520 of the auxiliary tool 500 and the second magnet 321 of the second coupling member 320. FIG. 11A is a cross-sectional view illustrating a state in which the LED panel 200 is disposed on the base plate 110 of the cabinet 100, and FIG. 11B is a view illustrating a state in which the first coupling member 310 is accommodated in the accommodating groove 325 of the second coupling member 320 in the state in which the LED panel 200 is disposed on the base plate 110 of the cabinet 100.

Referring to FIGS. 11A and 11B, the auxiliary tool 500 is removed from the LED panel 200 (operation S103). Even when the auxiliary tool 500 is removed, the locking portion 322 of the second coupling member 320 is maintained at the unlocking position by an attractive force between the second magnet 321 and the fixing members 324 including the magnetic material.

In this case, an N pole of the first magnet 520 of the auxiliary tool 500 faces the LED panel 200 and the auxiliary tool 500 is attached to the LED panel 200 so that the attractive force acts between the first magnet 520 of the auxiliary tool 500 and the second magnet 321 of the second coupling member 320 (operation S104). The attractive force acts between the first coupling member 310 magnetized as the N pole by the first magnet 520 and the second magnet 321, and the locking portion 322 is moved to the locking position.

Figure 12A:
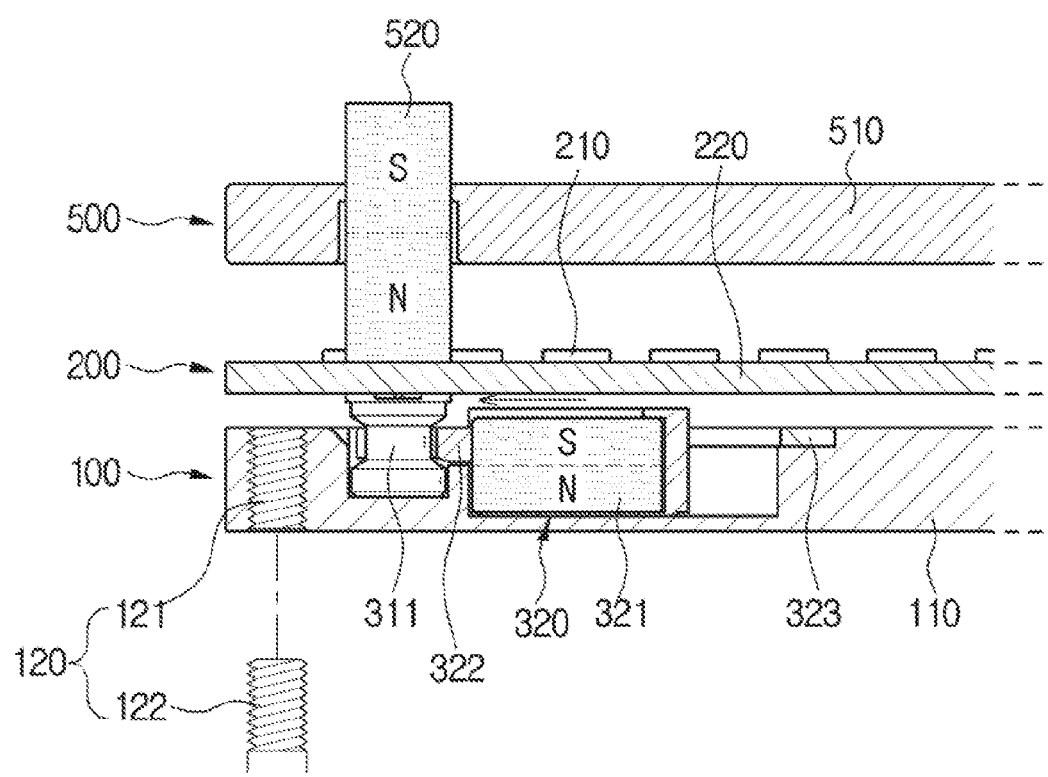
FIG. 12A and FIG. 12B are views illustrating a state in which the coupling member provided on the cabinet is moved to a locking position in the state in which the LED panel of FIG. 10 is disposed on the cabinet.
Figure 12B:
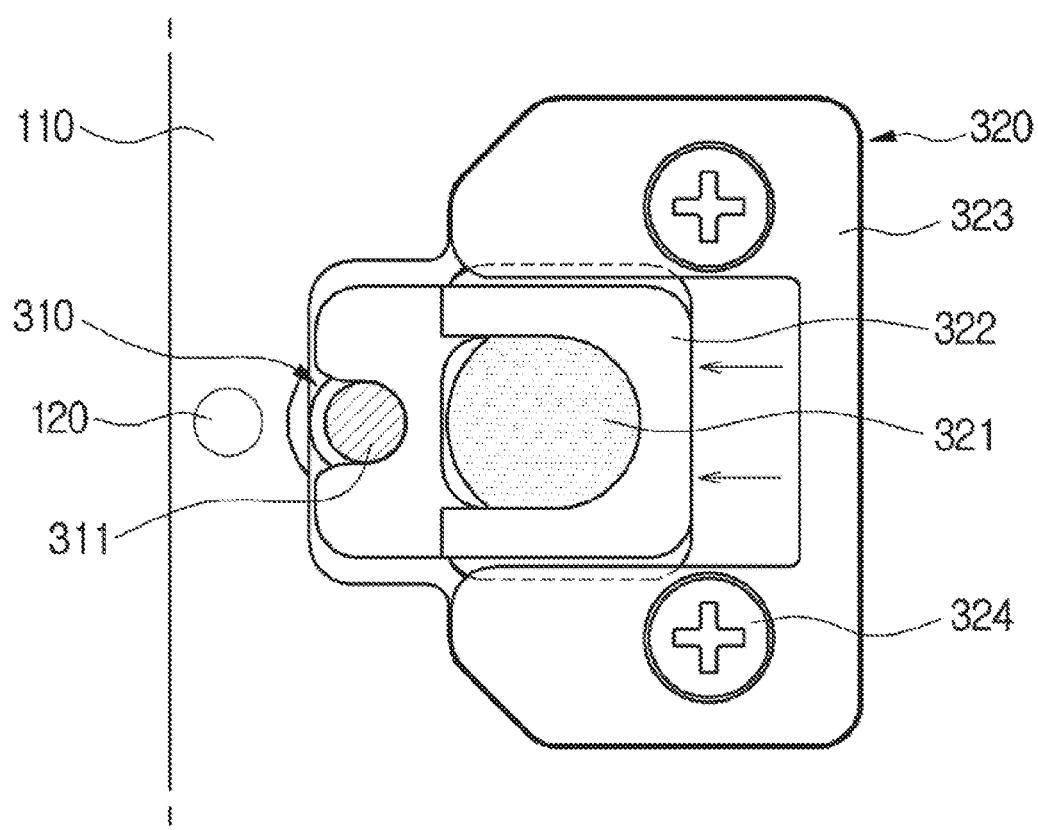

FIGS. 12A and 11B are views illustrating a state in which the locking portion 322 is moved to the locking position. FIG. 12A is a cross-sectional view illustrating a state in which the auxiliary tool 500 is attached to the LED panel 200 disposed on the base plate 110 of the cabinet 100, and FIG. 12B is a view illustrating a state in which the locking portion 322 of the second coupling member 320 is moved to the locking position and is engaged with the engaging portion 311 of the first coupling member 310.

When the locking portion 322 is moved to the locking position, the locking portion 322 fixes the engaging portion 311 of the first coupling member 310, and the LED panel 200 may no longer be separated from the cabinet 100. After the locking portion 322 is moved to the locking position, the auxiliary tool 500 is removed from the LED panel 200 (operation S105). Even when the auxiliary tool 500 is removed, the locking portion 322 is maintained at the locking position by the magnetic attractive force between the first coupling member 310 and the second magnet 321 which include the magnetic material. Since a distance between the first coupling member 310 and the second magnet 321 is smaller than a distance between the second magnet 321 and the fixing member 324, the magnetic attractive force between the first coupling member 310 and the second magnet 321 is greater than the magnetic attractive force between the second magnet 321 and the fixing members 324.

When the LED panel 200 is coupled to the cabinet 100 using the coupling devices including the first coupling member 310 and the second coupling member 320 and the auxiliary tool according to the exemplary embodiment, the process may be quickly performed in comparison to a method in which the LED panel 200 is fixed using screws or other fixing members. Also, since the LED panel 200 is mounted at an accurate position, the risk of product breakage which may occur by the LED panel 200 being attached at a wrong position by the magnetic force may be reduced in the method of using the magnet or the magnetic force.

Figure 16:
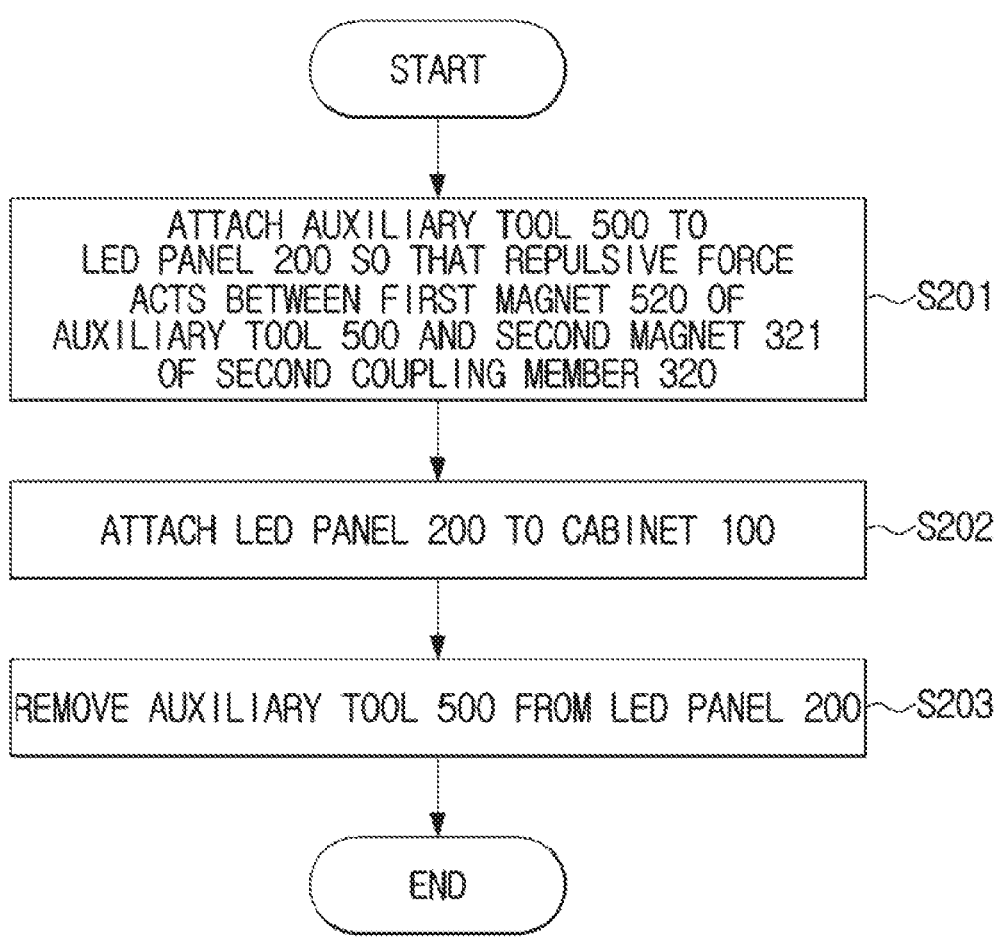
FIG. 16 is a flowchart of a method of disassembling the display module according to the exemplary embodiment.

Hereinafter, a method of separating the LED panel 200 from the base plate 110 of the cabinet 100 will be described with reference to FIGS. 10 to 12 in reverse order and with reference to FIG. 16. FIG. 16 is a flowchart of a method of disassembling the display module according to the exemplary embodiment.

The display module in which the LED panel 200 is mounted on the cabinet 100 is prepared. The LED panel 200 may include the first coupling members 310 and the cabinet 100 may include the second coupling member 320. In addition, the auxiliary tool 500 is prepared to easily separate the LED panel 200 from the cabinet 100.

As illustrated in the drawing FIG. 12B, the locking portion 322 of the second coupling member 320 is at the locking position in a state in which the LED panel 200 is mounted on the cabinet 100.

In this case, as illustrated in FIG. 11A, when the auxiliary tool 500 is attached to the LED panel 200 so that the S pole of the first magnet 520 faces the LED panel 200 in order for the repulsive force to act between the first magnet 520 of the auxiliary tool 500 and the second magnet 321 of the second coupling member (operation S201), the locking portion 322 is moved to the unlocking position.

After the locking portion 322 is moved to the unlocking position, the LED panel 200 may be separated from the cabinet 100 in a direction opposite to a direction of an arrow illustrated in FIG. 10 (operation S202). Then, the auxiliary tool 500 is removed from the LED panel 200 (operation S203).

When the LED panel 200 is separated from the cabinet 100 using the coupling devices and the auxiliary tool according to the exemplary embodiment, the process may be quickly performed in comparison to a method in which the LED panel 200 is separated by releasing screws or other fixing members. Also, the separation of the LED panel 200 may be performed at a front surface of the display module or the display device, and thus an LED panel in which defects occur may be accurately separated. Even when a working space in the back surface of the display device is small, the LED panel may be easily separated, replaced and mounted.

In the above description, although the exemplary embodiment in which the first coupling member 310 is provided in the LED panel 200, the second coupling member 320 is provided in the cabinet 100, and the LED panel 200 is coupled to and/or separated from the cabinet 100 by moving the locking portion 322 of the second coupling member 320, is described, but is not limited thereto. For example, positions at which the first coupling member 310 and the second coupling member 320 are installed may be changed, and the first coupling member 310 may be moved to the locking or unlocking position or the first coupling member 310 and the second coupling member 320 may be simultaneously moved to the locking or unlocking position, according to design requirements.

Figure 13:
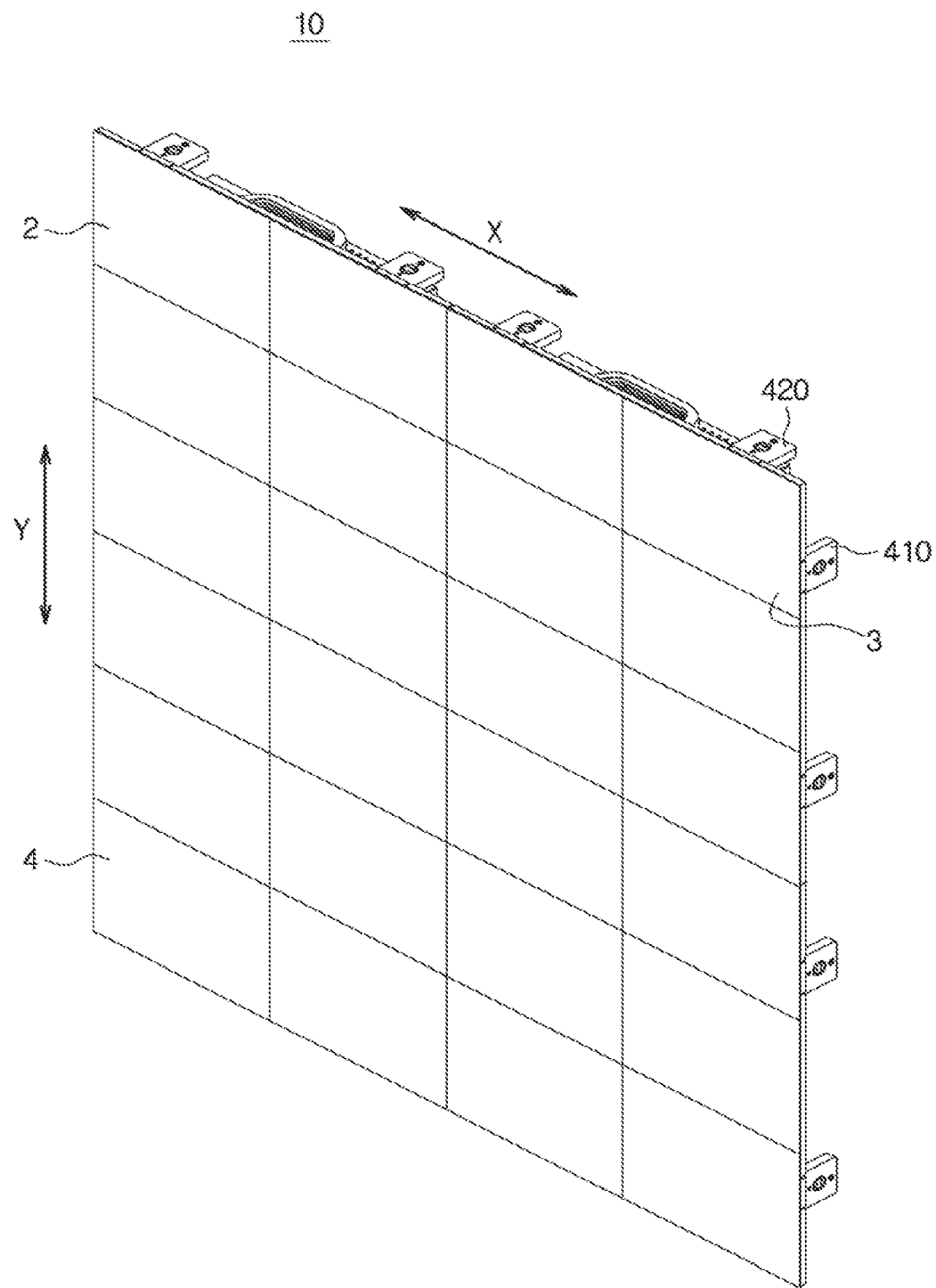
FIG. 13 is a perspective view illustrating an exterior of a display device according to an exemplary embodiment in one side view.
Figure 14:
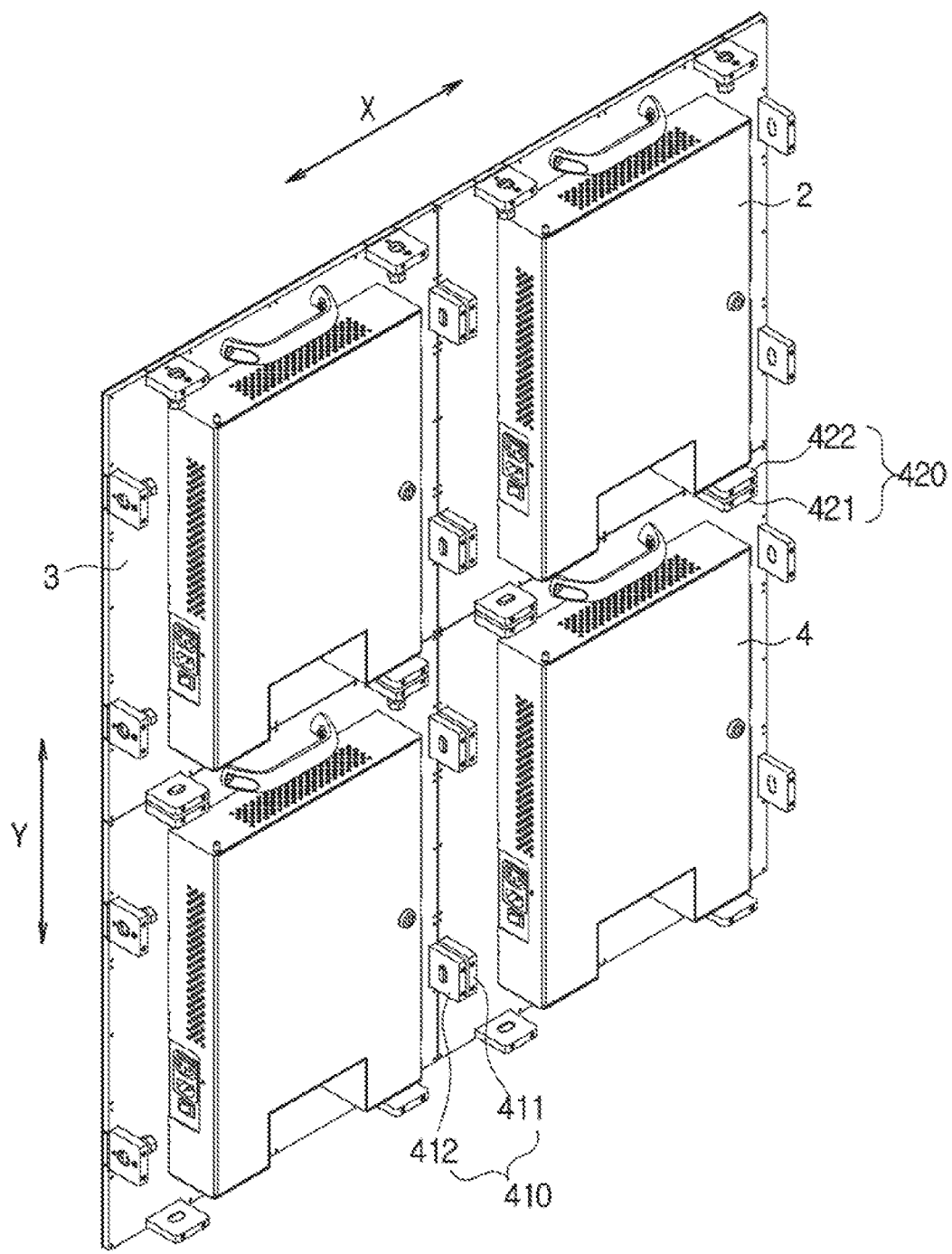
FIG. 14 is a perspective view illustrating the exterior of the display device of FIG. 13 in the other side view.

FIG. 13 is a perspective view illustrating an exterior of a display device according to an exemplary embodiment in one side view, and FIG. 14 is a perspective view illustrating the exterior of the display device of FIG. 13 in the other side view.

Referring to FIGS. 1, 13 and 14, a display device 10 may include a plurality of display modules 1. The plurality of display modules 1 may be arranged in a first direction X, in a second direction Y, or in the first direction X and the second direction Y, as much as a desired size of the display device 10.

For example, the plurality of display modules 1 may include a first display module 2 and at least one second display module 3 arranged in the first direction X with respect to the first display module 2. Also, the plurality of display modules 1 may include at least one third display module 4 arranged in the second direction Y with respect to the first display module 2.

The display module according to the exemplary embodiment may be applied to the plurality of display modules 1 included in the display device 10. Therefore, the coupling of the display module 1 will be described below.

The cabinet 100 of the display module 1 may include at least one connecting device 400 provided to be coupled to another display module.

For example, the first display module 2 and the second display module 3 may be connected to each other in the first direction X by first connecting devices 410 provided respectively on a cabinet 100 of the first display module 2 and a cabinet 100 of the second display module 3.

The first display module 2 and the third display module 4 may be connected to each other in the second direction Y by second connecting devices 420 provided respectively on the cabinet 100 of the first display module 2 and a cabinet 100 of the third display module 4.

The first connecting device 410 may include at least one first link 411 provided at one side of each of the first display module 2 and the second display module 3, and at least one second link 412 provided at the other sides thereof, and the second connecting device 420 may include at least one third link 421 provided at one side of each of the first display module 2 and the third display module 4, and at least one fourth link 422 provided at the other sides thereof.

When the plurality of display modules 1 are coupled to each other by the connecting devices 400, a boundary or a seam may be formed between display modules 1 disposed adjacent to each other. In the same way, a boundary is remarkably shown between the LED panels 200, when a step is generated between the display modules 1 in a high-definition display having small-sized LEDs 210.

The step generated between the display modules 1 may be adjusted by the step adjusters 120 of the LED panel 200 included in each of the display modules 1. For example, the step generated between the display modules 1 may be adjusted by the plurality of step adjusters 120 disposed at edges of the display modules 1.

Figure 17:
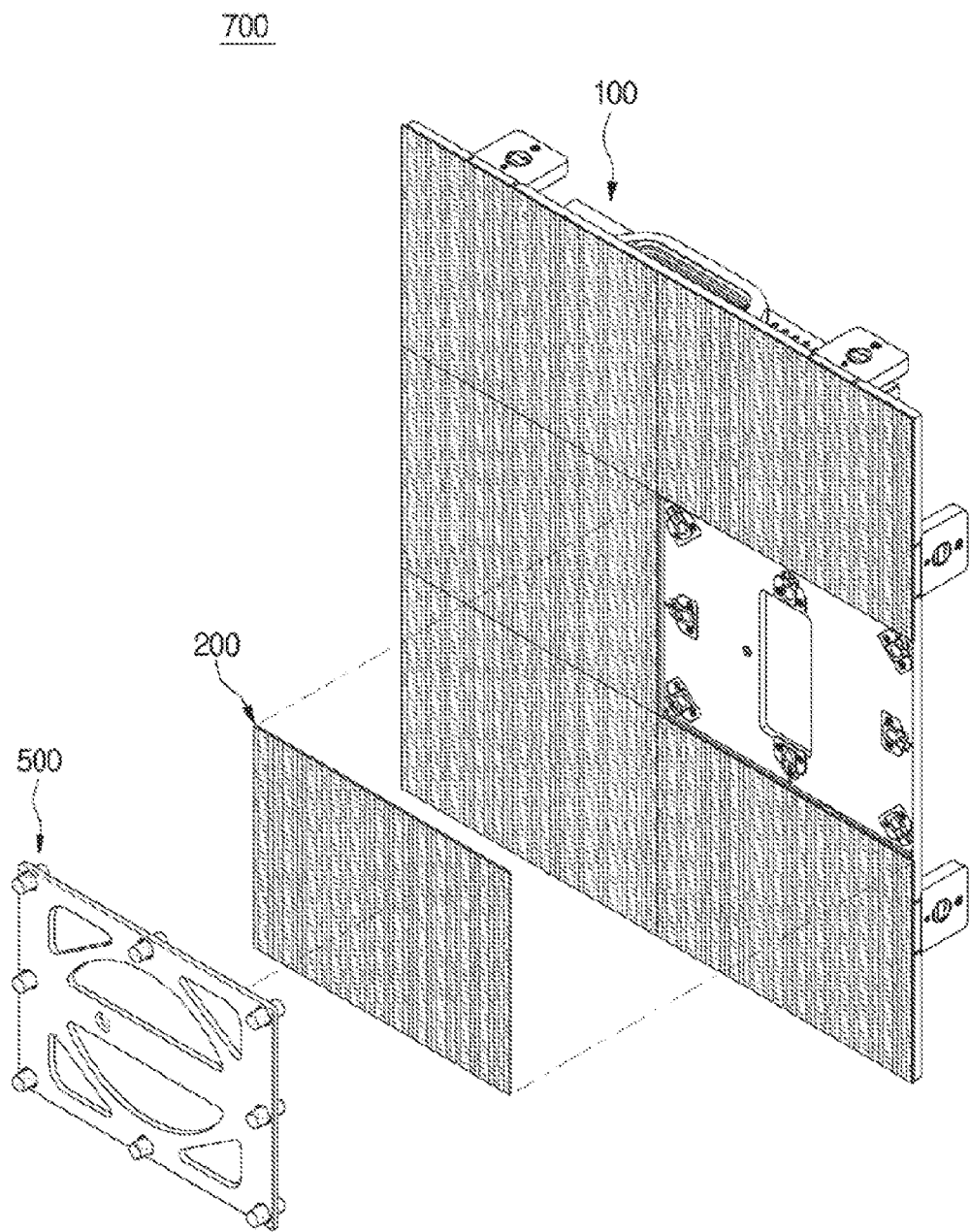
FIG. 17 is a perspective view illustrating a display module assembly kit according to the exemplary embodiment.

FIG. 17 is a perspective view illustrating a display module assembly kit according to the exemplary embodiment. Referring to FIG. 17, a display module assembly kit 700 may include LED panels 200, cabinets 100, and an auxiliary tool 500. Detailed configurations of the LED panels 200, the cabinets 100, and the auxiliary tool 500 are the same as in the description thereof in FIGS. 1 to 12.

According to the above-described display module, LED panels can be easily assembled to a cabinet by a magnetic force using a coupling device included in the display module, and product defects that may be caused can also be reduced.

Accordingly, the above-described display module or display device can be easily moved from and/or coupled to another display module using the connecting device included in the display module.

Also, according to the above-described method of assembling and disassembling the display module, the LED panels can be quickly and accurately assembled to the display module, and the LED panels mounted on the display module can be easily removed or replaced.

Although a few exemplary embodiments have been shown and described, it would be appreciated by those skilled in the art that changes may be made in the exemplary embodiments without departing from the principles and spirit of the disclosure, the scope of which is defined in the claims and their equivalents.

What is claimed is:

1. A display module comprising:
   a cabinet;
   a light-emitting diode (LED) panel mounted on the cabinet; and a coupling device configured to detachably mount the LED panel on the cabinet, wherein the coupling device comprises a first coupling member and a second coupling member, and at least one of the first coupling member and the second coupling member is configured to be moved by mutual magnetic force, wherein the first coupling member is provided at the LED panel and includes an engaging portion, and the second coupling member is provided at the cabinet and includes an accommodating groove configured to accommodate the first coupling member and a locking portion configured to fix the engaging portion of the first coupling member by moving to a locking position when the first coupling member is accommodated in the accommodating groove, wherein the first coupling member includes a magnetic material, and the locking portion of the second coupling member includes a magnet, and wherein the second coupling member includes a magnetic material configured to maintain the locking portion at an unlocking position by a magnetic force when the LED panel is not mounted on the cabinet.

2. A display module comprising:
a cabinet;
a light-emitting diode (LED) panel mounted on the cabinet; and
a coupling device configured to detachably mount the LED panel on the cabinet, wherein the coupling device comprises a first coupling member and a second coupling member, and at least one of the first coupling member and the second coupling member is configured to be moved by mutual magnetic force, wherein the first coupling member is provided at the LED panel and includes an engaging portion, and the second coupling member is provided at the cabinet and includes an accommodating groove configured to accommodate the first coupling member and a locking portion configured to fix the engaging portion of the first coupling member by moving to a locking position when the first coupling member is accommodated in the accommodating groove, wherein the first coupling member includes a magnetic material, and the locking portion of the second coupling member includes a magnet, and wherein:
the second coupling member is fixed to the cabinet by a fixing member including a magnetic material; and
the fixing member is disposed so that the locking portion is maintained at an unlocking position by a magnetic force when the LED panel is not mounted on the cabinet.

3. A display module assembly kit, comprising:
an LED panel in which a first coupling member is provided;
a cabinet in which a second coupling member is provided and the LED panel is detachably mounted by using the first coupling member and the second coupling member; and
an auxiliary tool comprising a body and a plurality of magnets, and configured to magnetize at least one of the first coupling member and the second coupling member when the auxiliary tool is placed on a front surface of the LED panel so that at least one of the first coupling member and the second coupling member is moved by a mutual magnetic force, thereby locking or unlocking the first coupling member with the second coupling member, the auxiliary tool being formed with a size and a shape corresponding to those of the LED panel, wherein the plurality of magnets penetrate the body so that same poles of the plurality of magnets face a same direction.

4. The kit according to claim 3, wherein:
one of the first coupling member and the second coupling member comprises a magnetic material;
the other of the first coupling member and the second coupling member comprises a magnet; and
the auxiliary tool magnetizes the magnetic material so that an attractive force or a repulsive force acts with the magnet and moves at least one of the first coupling member and the second coupling member to a locking or unlocking position.

5. The kit according to claim 3, wherein:
the first coupling member is disposed on a back surface of the LED panel and comprises an engaging portion; and
the second coupling member is disposed on a front surface of the cabinet and comprises:
an accommodating groove configured to accommodate the first coupling member; and
a locking portion configured to move to a locking position when the first coupling member is accommodated in the accommodating groove, thereby fixing the engaging portion of the first coupling member.

6. The kit according to claim 3, wherein the auxiliary tool comprises a body provided to have a size and a shape corresponding to the LED panel and a magnet provided to correspond to a position of the first coupling member provided in the LED panel.

7. A display module assembly kit, comprising:
an LED panel in which a first coupling member is provided;
a cabinet in which a second coupling member is provided and the LED panel is detachably mounted by using the first coupling member and the second coupling member; and
an auxiliary tool configured to magnetize at least one of the first coupling member and the second coupling member so that at least one of the first coupling member and the second coupling member is moved by a mutual magnetic force, thereby locking or unlocking the first coupling member with the second coupling member, wherein:
the first coupling member is disposed on a back surface of the LED panel and comprises an engaging portion; and
the second coupling member is disposed on a front surface of the cabinet and comprises:
an accommodating groove configured to accommodate the first coupling member; and
a locking portion configured to move to a locking position when the first coupling member is accommodated in the accommodating groove, thereby fixing the engaging portion of the first coupling member, and wherein:
the first coupling member comprises a magnetic material;
the locking portion of the second coupling member comprises a magnet; and
the auxiliary tool magnetizes the magnetic material so that an attractive force acts with the magnet when the first coupling member is accommodated in the accommodating groove and moves the locking portion to the locking position.

8. The kit according to claim 7, wherein the auxiliary tool magnetizes the magnetic material so that a repulsive force acts with the magnet in order to prevent the locking portion from being moved to the locking position before the first coupling member is accommodated in the accommodating groove or in order to move the locking portion from the locking position to an unlocking position.

9. The kit according to claim 7, wherein:
the second coupling member comprises a magnetic material configured to maintain the locking portion to be at an unlocking position by the attractive force with the magnet included in the locking portion when the LED panel is not mounted on the cabinet; and
the auxiliary tool magnetizes the magnetic material included in the first coupling member so that the attractive force acts with the magnet included in the locking portion in order to move the locking portion to the locking position after the engaging portion of the first coupling member is accommodated in the accommodating groove.

10. An auxiliary tool for assembling a display module comprising a cabinet on which an LED panel is mounted by using a coupling device comprising a first coupling member and a second coupling member, comprising:
a body formed with a size and a shape corresponding to those of the LED panel; and
a plurality of magnets configured to magnetize at least one of the first coupling member and the second coupling member when the auxiliary tool is placed on a front surface of the LED panel so that at least one of the first coupling member and the second coupling member is moved by a mutual magnetic force, thereby locking or unlocking the first coupling member with the second coupling member,
wherein the plurality of magnets penetrate the body so that same poles of the plurality of magnets face a same direction.

* * * * *